(12) United States Patent
Bijivemula et al.

(10) Patent No.: US 11,948,624 B2
(45) Date of Patent: Apr. 2, 2024

(54) MEMORY BIT CELL ARRAY INCLUDING CONTENTION-FREE COLUMN RESET CIRCUIT, AND RELATED METHODS

(71) Applicant: Microsoft Technology Licensing, LLC, Redmond, WA (US)

(72) Inventors: Sai Prakash Reddy Bijivemula, Raleigh, NC (US); Rajesh Kumar, Apex, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 181 days.

(21) Appl. No.: 17/560,380

(22) Filed: Dec. 23, 2021

(65) Prior Publication Data

US 2023/0206993 A1 Jun. 29, 2023

(51) Int. Cl.
| | |
|---|---|
| *G11C 5/14* | (2006.01) |
| *G11C 5/06* | (2006.01) |
| *G11C 11/4074* | (2006.01) |
| *G11C 11/408* | (2006.01) |
| *G11C 11/4094* | (2006.01) |

(52) U.S. Cl.
CPC .......... *G11C 11/4094* (2013.01); *G11C 5/063* (2013.01); *G11C 11/4074* (2013.01); *G11C 11/4085* (2013.01)

(58) Field of Classification Search
CPC ..... G11C 15/00; G11C 11/4094; G11C 5/063; G11C 11/4074; G11C 11/4085; G11C 11/419; G11C 11/412
See application file for complete search history.

(56) References Cited

U.S. PATENT DOCUMENTS

| | | | |
|---|---|---|---|
| 6,807,107 B1 * | 10/2004 | McGee | G11C 11/412 |
| | | | 365/189.08 |
| 7,920,397 B1 * | 4/2011 | Nataraj | G11C 7/12 |
| | | | 365/49.1 |

(Continued)

FOREIGN PATENT DOCUMENTS

EP  1239487 A1  9/2002

OTHER PUBLICATIONS

"International Search Report and Written Opinion issued in PCT Application No. PCT/US22/044467", dated Jan. 31, 2023, 9 Pages. (MS# 410651-WO-PCT).

*Primary Examiner* — Mushfique Siddique
(74) *Attorney, Agent, or Firm* — Withrow & Terranova, PLLC (57) ABSTRACT

A column in a memory array includes one bit cell circuit in each row for storing information about the row. The bit cell circuits store data in a data node and a complement data node in a cross-coupled inverter circuit. Toggling the nodes in a cross-coupled inverter includes discharging a charged node in contention with a charge current provided in the cross-coupled inverter circuit. The column circuit includes a first voltage supply circuit to decouple the cross-coupled inverter circuits from a first voltage rail to cut off charging current in response to a column set signal in a column set operation. The cross-coupled inverters of the bit cell circuits in the column circuit are coupled to a first voltage supply line. The column set input controls the first voltage supply circuit to decouple the first voltage supply line from a first voltage rail.

17 Claims, 7 Drawing Sheets

(56) References Cited

U.S. PATENT DOCUMENTS

| | | | |
|---|---|---|---|
| 2012/0147680 A1* | 6/2012 | Koike | G11C 5/147 365/189.011 |
| 2013/0341642 A1* | 12/2013 | Gan | H10B 10/12 257/77 |
| 2015/0036418 A1 | 2/2015 | Chai et al. | |
| 2015/0131368 A1* | 5/2015 | Adams | G06F 30/36 716/110 |

* cited by examiner

FIG. 1

-- PRIOR ART --

SETTING DATA NODES (316T) IN A PLURALITY OF BIT CELL CIRCUITS (306(0)- 306(N)) IN A COLUMN CIRCUIT (302) IN A MEMORY ARRAY (300), THE COLUMN CIRCUIT (302) COMPRISING:

A BIT LINE (312T);
    A COMPLEMENT BIT LINE (312C);
    A FIRST VOLTAGE SUPPLY LINE (320T);
    A FIRST VOLTAGE SUPPLY CIRCUIT (304T) COUPLED TO THE FIRST VOLTAGE SUPPLY LINE (320T) AND A FIRST VOLTAGE RAIL (324); AND
    A SECOND VOLTAGE SUPPLY LINE (320C);
    A SECOND VOLTAGE SUPPLY CIRCUIT (304C) COUPLED TO THE SECOND VOLTAGE SUPPLY LINE (320C) AND THE FIRST VOLTAGE RAIL (324);
    EACH OF THE PLURALITY OF BIT CELL CIRCUITS (306(0)-306(N)) COUPLED TO THE FIRST SUPPLY VOLTAGE LINE (320T), THE SECOND SUPPLY VOLTAGE LINE (320C), AND A SECOND VOLTAGE RAIL (326), AND EACH OF THE PLURALITY OF BIT CELL CIRCUITS (306(0)-306(N)) COMPRISING:
        A CROSS-COUPLED INVERTER CIRCUIT (314) COMPRISING:
            A DATA NODE (316T); AND
            A COMPLEMENT DATA NODE (316C);
        A FIRST PASS-GATE (318T) COUPLED TO THE DATA NODE (316T) AND THE BIT LINE (312T), AND
        A SECOND PASS-GATE (318C) COUPLED TO THE COMPLEMENT DATA NODE (316C) AND THE COMPLEMENT BIT LINE (320C);
        A PLURALITY OF WORD LINES 348(0)-348(N) EACH COUPLED TO A GATE (350) OF THE FIRST PASS-GATE (318T) AND A GATE (352) OF THE SECOND PASS-GATE (318T) OF A CORRESPONDING ONE OF THE PLURALITY OF BIT CELL CIRCUITS (306(0)-306(N)), AND
        A COLUMN SET INPUT (328) COUPLED TO THE FIRST VOLTAGE SUPPLY CIRCUIT (304T) AND CONFIGURED TO RECEIVE A COLUMN SET SIGNAL (330),
    THE METHOD COMPRISING, IN RESPONSE TO THE COLUMN SET SIGNAL (330):

SUPPLY THE FIRST SUPPLY VOLTAGE ($V_{SUP1}$) TO EACH OF THE PLURALITY OF WORD LINES (348(0)-348(N)) —502

PROVIDE THE SECOND SUPPLY VOLTAGE ($V_{SUP2}$) ON THE BIT LINE (312T) —504

MEMORY BIT CELL ARRAY INCLUDING CONTENTION-FREE COLUMN RESET CIRCUIT, AND RELATED METHODS

FIELD OF THE DISCLOSURE

The technology of the disclosure relates in general to memory arrays and, more particularly, to circuits for modifying data stored in bit cells in a memory array.

BACKGROUND

Computer processors and other processing circuits operate on information in a binary format. The binary information is stored in memory arrays from which it can be accessed by a processor. Each bit of binary information is stored in a bit cell circuit, and the bit cell circuits are organized in rows and columns in a memory array. Word lines are provided in each row of a memory array to control access to the bit cell circuits in the row. Bit lines are provided in each column of the memory array to provide a data path for writing binary information into or reading binary information out of a bit cell circuit in the column. The binary information stored in a row may be referred to as a cache line. The entire cache line can be read by activating a word line for the row and capturing the binary information on the bit lines in every column. A cache line can be stored in a row by activating the word line and providing data on bit lines for each column in the array. In this manner, the data in every bit cell circuit can be accessed individually or as a cache line.

In some cases, it may also be desirable to access the binary information stored in every bit cell circuit in a column of an array. As an example, a content addressable memory (CAM)-random access memory (RAM) (CAM-RAM) is a memory structure often used for caches, branch target buffers, branch history tables, etc., to improve performance of a processing circuit. The components of a CAM-RAM structure include a tag array and a data array. A tag array can be used to search for a particular cache line stored in the data array, where such data is identifiable by a tag. The search can be implemented internally using a dynamic match line structure or by reading out content of the tag array for comparison to a tag. The tag array can include a column of bit cells that store information about the cache lines. For example, this column can indicate whether data in a cache line is invalid or missing from the cache line.

In some memory applications, it may be desirable to set all the bits in a column to the same value. One option for accomplishing this is to write individually to the bit cell circuit in every row of the column. Some arrays may be capable of writing a single bit cell circuit in a row, while others require a read-modify-write operation to update a single bit in each row. In either case, significant time and power are consumed for such operations. The word line/bit line configuration of existing memory arrays does not allow for manipulating all the bits in a column in the same operation.

Figure 1:
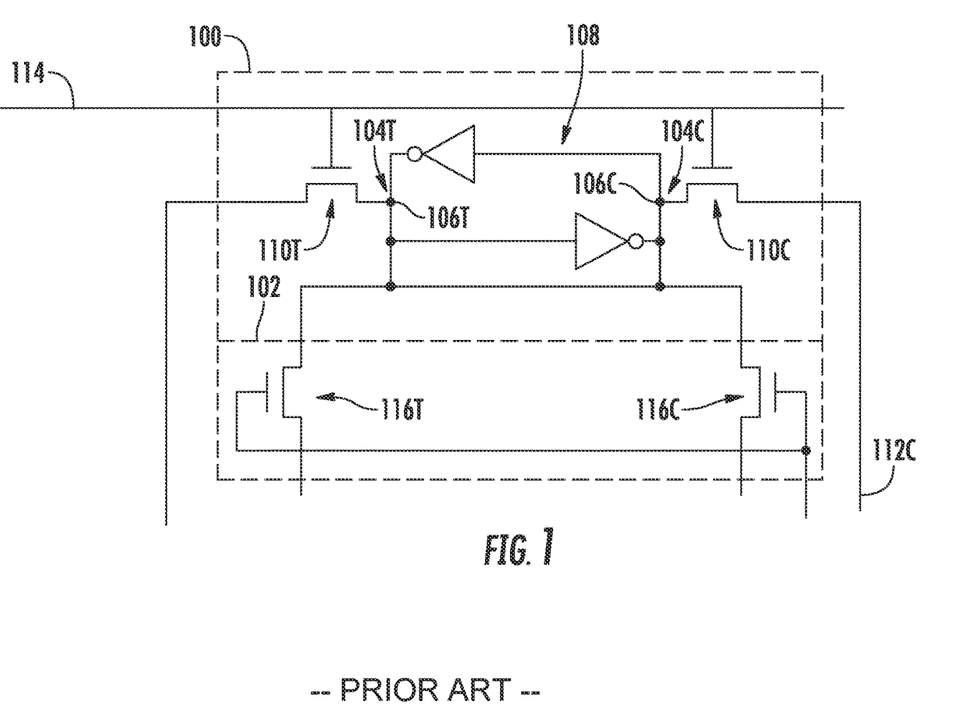
FIG. 1 is a schematic diagram of a bit cell circuit including a reset circuit as needed in every bit cell circuit in a column to perform a column set operation.

Examples of existing circuits are first described with reference to FIG. 1. FIG. 1 is a schematic diagram of an existing bit cell circuit 100, including a reset circuit 102 for providing an invalidate operation. The bit cell circuit 100 is configured to store a data value 104T in a data node 106T and store a complement data value 104C in a complement data node 106C. The reset circuit 102 is employed to reset the data node 106T to a binary zero "0" and set the complement data node 106C to a binary one "1" in an invalidate operation. The "T" and "C" on labels herein (e.g., 104T and 104C) refer to "true" and "complement" versions of data and other symmetrical aspects of the bit cell circuit 100.

The bit cell circuit 100 is a six (6) transistor (6T) memory bit configuration, including cross-coupled inverter circuit 108, first pass-gate 110T, and second pass-gate 110C. The first pass-gate 110T and the second pass-gate 110C can be used to write the data values 104T and 104C based on voltage states of a bit line 112T and a complement bit line 112C under control of a word line 114. In a memory array of bit cell circuits 100 disposed in rows and columns, a write to a bit cell circuit 100 in a row is controlled by a word line 114 corresponding to the row, and each row has a corresponding word line 114. The only word line 114 activated in the write operation is the word line 114 of the row to which data is written. Writing data to the data node 106T, for example, includes charging or discharging the data node 106T based on the bit line 112T, while the first pass-gate 110T is turned on by the word line 114. In a write operation, the bit line 112T is required to charge or discharge only one bit cell circuit 100. A bit driver (not shown) generating a value on the bit line 112T can set either a binary "0" or a binary "1" in the data node 106T in a write operation but is not powerful enough to reset every bit cell circuit 100 in a column in an invalidate operation.

In this regard, the reset circuit 102 is included in each bit cell circuit 100 in a column of a memory array to set the data node 106T to a binary "0" and set the complementary data node 106C to a binary "1". The reset circuit includes a pull-down circuit 116T coupled to the data node 106T and a pull-up circuit 116C coupled to the complementary data node 106C. In an invalidate operation, the pull-down circuit 116T is activated to discharge the data node 106T, and the pull-up circuit 116C is activated to charge the complementary data node 106C. However, the addition of the pull-down circuit 116T and the pull-down circuit 116C to every bit cell circuit 100 in a column of a memory array comes at the cost of a significant increase in area for the array. Thus, a more area-efficient solution would be preferred.

SUMMARY

Exemplary aspects disclosed herein include a column circuit in a memory array, including a column set circuit. Related methods of setting data bits in a column of bit cell circuits are also disclosed. A column in a memory array includes one bit cell circuit in each row for storing information about the row. An example of such information is an indication of whether a cache line stored in a row of the memory array is valid or invalid. The information can be set to a predetermined value in a column set operation (e.g., to invalidate all the cache lines in the memory array). The bit cell circuits store data in a data node and a complement data node in a cross-coupled inverter circuit. Setting a value in the bit cell circuits may include toggling the node values in some or all of the bit cell circuits in a column. Toggling the nodes in a cross-coupled inverter includes discharging a charged node, but such discharging is in contention with a charge current provided by a transistor in the cross-coupled inverter circuit. To force a cross-coupled inverter circuit to toggle, the voltage on a charged node is reduced by a discharge current that can overcome the charge current. A bit line driver in the column can discharge one and up to a few nodes when in contention with the charge current but cannot provide sufficient discharge current to toggle all the bit cell circuits in a column. In an exemplary aspect, the column circuit includes a first voltage supply circuit to decouple the cross-coupled inverter circuits from a first voltage rail to cut off charge current in response to a column set signal in a column set operation. The first voltage supply circuit is coupled to a first voltage supply line and the first voltage rail, and the cross-coupled inverters of the bit cell circuits in the column circuit are coupled to the first voltage supply line. The column set input controls the first voltage supply circuit to decouple the first voltage supply line from the first voltage rail. In this manner, in a column set operation, the data nodes and complement data nodes can be set to a predetermined value without contention from the cross-coupled inverter circuits, allowing the charged nodes of all the bit cell circuits in the column to be discharged by the bit line.

In exemplary aspects disclosed herein, a column circuit comprising a plurality of bit cell circuits is disclosed. The column circuit comprising a bit line, a complement bit line, a first voltage supply line, a first voltage supply circuit coupled to the first voltage supply line and a first voltage rail; a second voltage supply line; and a second voltage supply circuit coupled to the second voltage supply line and the first voltage rail. Each of the plurality of bit cell circuits is coupled to the first voltage supply line, the second voltage supply line, and a second voltage rail. Each of the plurality of bit cell circuits comprises a cross-coupled inverter circuit comprising a data node and a complement data node. Each of the plurality of bit cell circuits also comprises a first pass-gate coupled to the data node and the bit line and a second pass-gate coupled to the complement data node and the complement bit line, and a column set input coupled to the first voltage supply circuit and configured to receive a column set signal to control the first voltage supply circuit to decouple the first voltage supply line from the first voltage rail.

In another exemplary aspect, a memory array circuit comprising a column circuit is disclosed. The column circuit comprises a plurality of bit cell circuits, a bit line, a complement bit line, a first voltage supply line, a first voltage supply circuit coupled to the first voltage supply line and a first voltage rail, and a second voltage supply line, and a second voltage supply circuit coupled to the second voltage supply line and the first voltage rail. Each of the plurality of bit cell circuits is coupled to the first voltage supply line, the second voltage supply line, and a second voltage rail. Each of the plurality of bit cell circuits comprises a cross-coupled inverter circuit comprising a data node and a complement data node. Each of the plurality of bit cell circuits comprises a first pass-gate coupled to the data node and the bit line and a second pass-gate coupled to the complement data node and the complement bit line. A column set input coupled to the first voltage supply circuit includes a column set signal to control the first voltage supply circuit to decouple the first voltage supply line from the first voltage rail.

In another exemplary aspect, a method of setting data nodes in a plurality of memory bit cell circuits in a column circuit in a memory array is disclosed. The column circuit comprising a bit line, a complement bit line, a first voltage supply line, a first voltage supply circuit coupled to the first voltage supply line and a first voltage rail; a second voltage supply line; and a second voltage supply circuit coupled to the second voltage supply line and the first voltage rail. Each of the plurality of bit cell circuits is coupled to the first voltage supply line, the second voltage supply line, and a second voltage rail. Each of the plurality of bit cell circuits comprises a cross-coupled inverter circuit comprising a data node and a complement data node. Each of the plurality of bit cell circuits also comprises a first pass-gate coupled to the data node and the bit line and a second pass-gate coupled to the complement data node and the complement bit line, and a column set input coupled to the first voltage supply circuit and configured to receive a column set signal. The method comprises, in response to the column set signal, supplying the first supply voltage to each of the plurality of word lines, providing the second supply voltage on the bit line, providing the first supply voltage on the complement bit line, and controlling the first voltage supply circuit to decouple the first voltage supply line from the first voltage rail.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Exemplary aspects disclosed herein include a column circuit in a memory array, including a column set circuit. Related methods of setting data bits in a column of bit cell circuits are also disclosed. A column in a memory array includes one bit cell circuit in each row for storing information about the row. An example of such information is an indication of whether a cache line stored in a row of the memory array is valid or invalid. The information can be set to a predetermined value in a column set operation (e.g., to invalidate all the cache lines in the memory array). The bit cell circuits store data in a data node and a complement data node in a cross-coupled inverter circuit. Setting a value in the bit cell circuits may include toggling the node values in some or all of the bit cell circuits in a column. Toggling the nodes in a cross-coupled inverter includes discharging a charged node, but such discharging is in contention with a charge current provided by a transistor in the cross-coupled inverter circuit. To force a cross-coupled inverter circuit to toggle, the voltage on a charged node is reduced by a discharge current that can overcome the charge current. A bit line driver in the column can discharge one and up to a few nodes when in contention with the charge current but cannot provide sufficient discharge current to toggle all the bit cell circuits in a column. In an exemplary aspect, the column circuit includes a first voltage supply circuit to decouple the cross-coupled inverter circuits from a first voltage rail to cut off charge current in response to a column set signal in a column set operation. The first voltage supply circuit is coupled to a first voltage supply line and the first voltage rail, and the cross-coupled inverters of the bit cell circuits in the column circuit are coupled to the first voltage supply line. The column set input controls the first voltage supply circuit to decouple the first voltage supply line from the first voltage rail. In this manner, in a column set operation, the data nodes and complement data nodes can be set to a predetermined value without contention from the cross-coupled inverter circuits, allowing the charged nodes of all the bit cell circuits in the column to be discharged by the bit line.

Based on recent architectural requirements, memory arrays are designed to implement an invalidate functionality. A memory array needs to indicate that all the cache lines in the memory array are invalid by writing a predetermined data value in all the bit cell circuits ("valid bits") in a column of the memory array. Other purposes for the data stored in bits in a column of a memory array may also require that all bits are set to a predetermined value under some conditions. The predetermined data value may be a binary zero "0" in some memory arrays and a binary one "1" in other memory arrays depending on the information. The invalidate operation requires writing a data value (e.g., "0") to multiple valid bits at the same time. However, a write to the valid bits in multiple bit cell circuits cannot be achieved concurrently using the regular write port because the write bit line driver is not capable of overpowering many bit cell circuits simultaneously.

Figure 2:
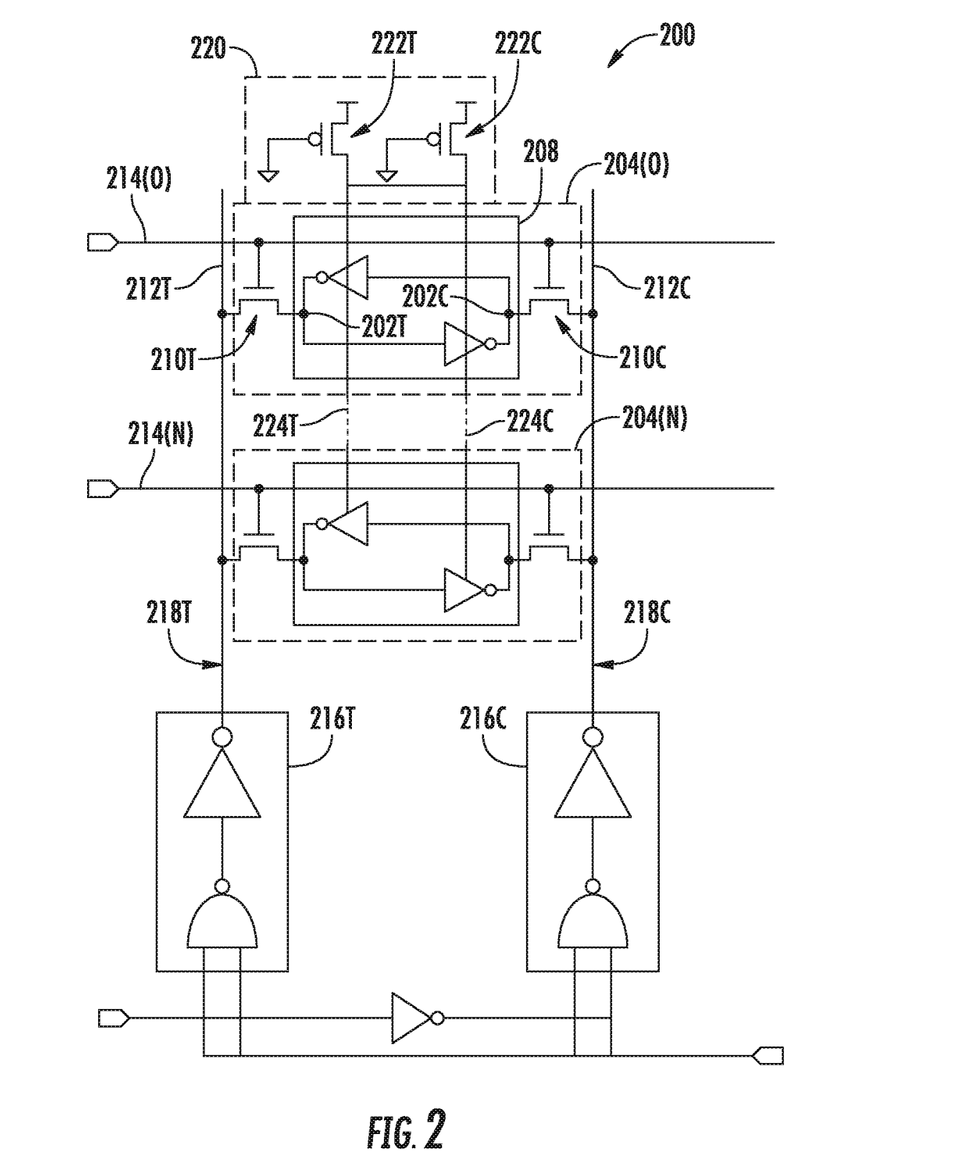
FIG. 2 is a schematic diagram of a memory array column circuit employed for reduced contention write operations in bit cell circuits in the column.

FIG. 2 is a schematic diagram of a column circuit 200 providing reduced contention write operations to data nodes 202T and complement data nodes 202C in bit cell circuits 204(0)-204(N). The bit cell circuits 204(0)-204(N) are 6T bit cell circuits, each including a cross-coupled inverter circuit 208, a first pass-gate 210T coupled to a bit line 212T, and a second pass-gate 210C coupled to a complement bit line 212C. The first pass-gates 210T and the second pass-gates 210C are controlled by word lines 214(0)-214(N). A write operation is performed by activating one of the word lines 214(0)-214(N) when a write clock signal WCLK is activated. In a write operation, bit line driver circuits 216T and 216C provide data 218T and complement data 218C, respectively, for storage in the data node 202T and complement data node 202C. The data node 202T and complement data node 202C are provided as complementary voltage levels on the bit line 212T and complement bit line 212C.

A header circuit 220 of the column circuit 200 includes pull-up transistors 222T and 222C to couple voltage supply lines 224T and 224C to a power voltage supply rail 226. The voltage supply lines 224T and 224C provide power to the cross-coupled inverter circuits 208. Adding the pull-up transistors 222T and 222C to the voltage supply lines 224T and 224C effectively halves the strength of the voltage supply lines 224T and 224C for charging one of the data nodes 202T and 202C. Since either the data node 202T or the complement data node 202C may need to be discharged in a write operation to a reference voltage ($V_{SS}$) in this manner, the pull-up transistors 222T and 222C are included on both of the voltage supply lines 224T and 224C. In this manner, contention is reduced between, for example, the cross-coupled inverter circuit 208 charging the data node 202T and the bit line 212T discharging the data node 202T, which increases the speed of toggling the states of the bit cell circuits 204(0)-204(N).

Figure 3:
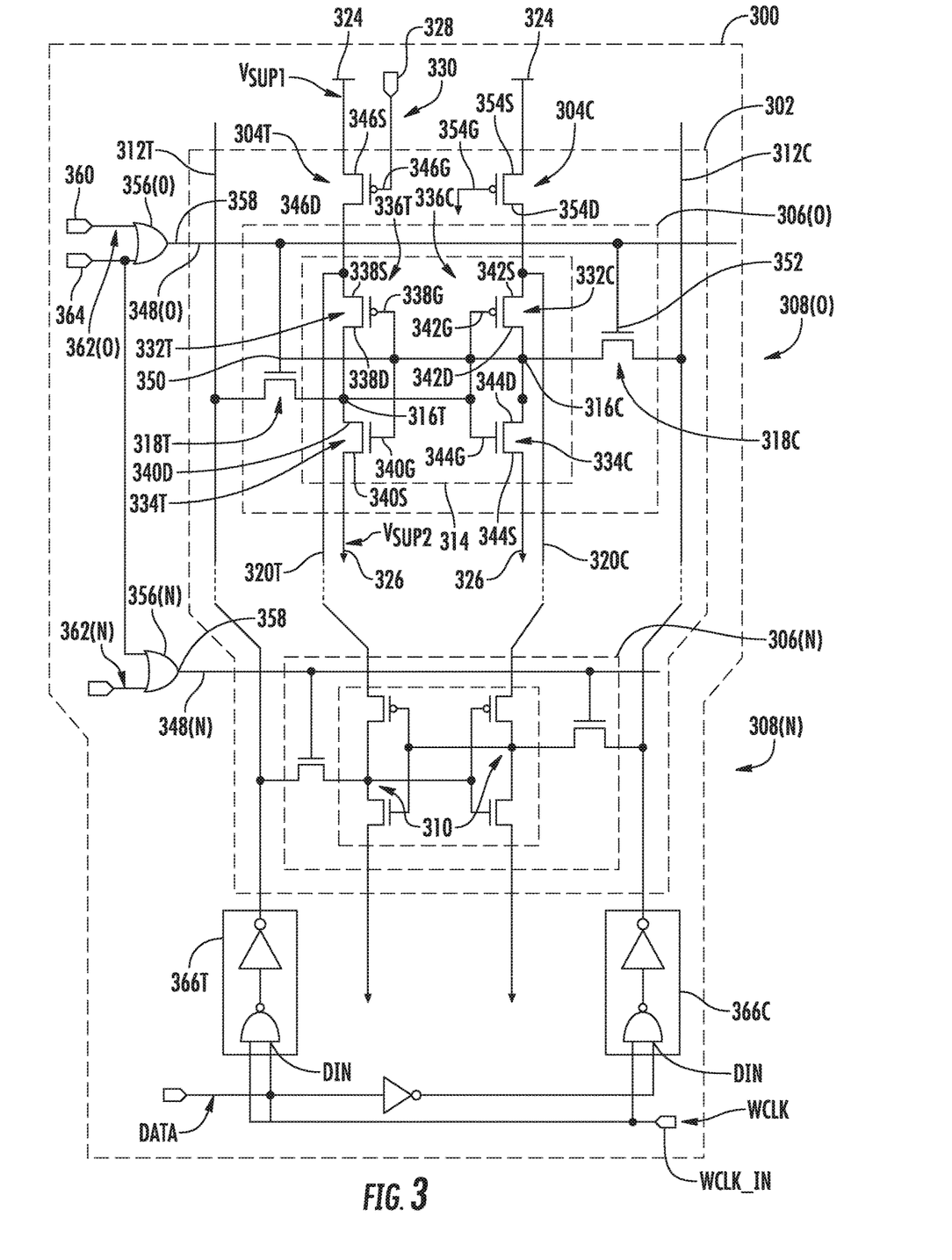
FIG. 3 is a schematic diagram of an exemplary memory array including a column circuit including a voltage supply circuit to cut off a supply voltage to avoid contention in a column set operation setting bit cell circuits to a first predetermined value.

FIG. 3 is a schematic diagram of an exemplary memory array circuit 300, referred to herein as memory array 300, including a column circuit 302 including a first voltage supply circuit 304T to decouple (e.g., cut off) a supply voltage to avoid contention in a column set operation setting a plurality of bit cell circuits 306(0)-306(N) in the column circuit 302 to a predetermined value. The bit cell circuits 306(0)-306(N) in rows 308(0)-308(N) of the memory array 300 each store information 310, such as a valid bit or other information, about a cache line (not shown) or other data in the corresponding rows 308(0)-308(N) of the memory array 300. The information 310 may also or alternatively be information about a cache line or other data in rows of another memory array and/or a memory bank. The memory array 300 supports the column set operation to set the information 310 in the bit cell circuits 306(0)-306(N) to a predetermined value. In some examples, the information 310 in each of the bit cell circuits 306(0)-306(N) of a cache memory is a valid bit, indicating that the corresponding cache lines or other data stored in the rows 308(0)-308(N) are valid. In such examples, the column set operation may be referred to as an invalidate operation in which the information 310 in each of the bit cell circuits 306(0)-306(N) is set to the reference voltage $V_{SS}$ (e.g., 0V), which corresponds to a binary "0" to indicate a cache line is invalid. An invalidate operation may be performed when a cache line is flushed (e.g., in a context change) or upon a system reset. During normal operation, the information 310 in a single bit cell circuit 306(0)-306(N) may be set to a first supply voltage $V_{SUP1}$ representing a binary "1" to indicate a cache line in a corresponding row 308(0)-308(N) is valid, such as when a new cache line is stored in a memory. Individual cache lines in one of the rows 308(0)-308(N) can also be invalidated by a write operation in which one of the bit cell circuits 306(0)-306(N) is set to a second supply voltage $V_{SUP2}$ corresponding to a binary "0". Thus, the bit cell circuits 306(0)-306(N) may be set to the supply voltage $V_{SUP1}$ or the second supply voltage $V_{SUP2}$ one at a time in a write operation, or all of the bit cell circuits 306(0)-306(N) can be set to the predetermined value (binary "0) of the second supply voltage $V_{SUP2}$ in the same column set operation. In the example of a column circuit 302 in FIG. 3, the first supply voltage $V_{SUP1}$ is a power supply voltage $V_{DD}$ and the second supply voltage $V_{SUP2}$ is a reference voltage $V_{SS}$ (e.g., ground).

With further reference to FIG. 3, the column circuit 302 includes a bit line 312T and a complement bit line 312C that are each coupled to the plurality (e.g., N+1) of bit cell circuits 306(0)-306(N). The bit cell circuits 306(0)-306(N) each include a cross-coupled inverter circuit 314, which includes a data node 316T and a complement data node 316C. The information 310 is binary information stored in the data node 316T and 316C in true and complement forms. Each of the bit cell circuits 306(0)-306(N) also includes a first pass-gate 318T coupled to the data node 316T and the bit line 312T, and a second pass-gate 318C coupled to the complement data node 316C and the complement bit line 312C. Labels ending in "T" and "C" may refer to symmetrical features on respective sides of the cross-coupled inverter circuits 314.

The column circuit 302 includes a first voltage supply line 320T and a second voltage supply line 320C coupled to the cross-coupled inverter circuit 314 in each of the bit cell circuits 306(0)-306(N). The column circuit 302 also includes a first voltage supply circuit 304T coupled to the first voltage supply line 320T and to a first voltage rail 324. The column circuit 302 also includes a second voltage supply circuit 304C coupled to the second voltage supply line 320C and to the first voltage rail 324. The bit cell circuits 306(0)-306(N) are also coupled to a second voltage rail 326. The column circuit 302 also includes a column set input 328 coupled to the first voltage supply circuit 304T and configured to supply a column set signal 330 to control the first voltage supply circuit 304T to decouple (e.g., cut off or turn off the electrical path to) the first voltage supply line 320T from the first voltage rail 324.

A purpose for providing the first voltage supply circuit 304T in the column circuit 302 is discussed below, following a description of the components and connections thereof of the cross-coupled inverter circuit 314. The cross-coupled inverter circuit 314 includes a first P-type transistor 332T and a first N-type transistor 334T that together form a first inverter 336T whose output is the data node 316T. The cross-coupled inverter circuit 314 also includes a second P-type transistor 332C and a second N-type transistor 334C that form a second inverter 336C whose output is the complement data node 316C. A P-type transistor, as referred to herein, is formed of a semiconductor material (e.g., silicon) doped with a trivalent material, and an N-type transistor is formed of the semiconductor material doped with a pentavalent material. The P-type and N-type transistors may be field-effect transistors (FETs) (e.g., PFETs and NFETs).

The first P-type transistor 332T includes a first terminal 338S, a second terminal 338D, and a gate 338G. The second terminal 338D is coupled to the data node 316T. The first N-type transistor 334T includes a first terminal 340D coupled to the data node 316T, a second terminal 340S, and a gate 340G coupled to the complement data node 316C. The second P-type transistor 332C includes a first terminal 342S, a second terminal 342D coupled to the complement data node 316C, and a gate 342G coupled to the data node 316T. The second N-type transistor 334C includes a first terminal 344D coupled to the complement data node 316C, a second terminal 344S, and a gate 344G coupled to the data node 316T. The first voltage rail 324 supplies the first supply voltage $V_{SUP1}$, which is the power supply voltage $V_{DD}$ in FIG. 3, and the second voltage rail 326 supplies the second supply voltage $V_{SUP2}$, which is the reference voltage $V_{SS}$. In this example, the first pass-gate 318T is an N-type transistor (e.g., NFET) but may be a PFET. The first terminal 338S of the first P-type transistor 332T is coupled to the first voltage supply line 320T, the first terminal of the second P-type transistor 332C is coupled to the second voltage supply line 320C, and the second terminals 340S and 344S of the first N-type transistor 334T and the second N-type transistor 334C are coupled to the second voltage rail 326.

An operation of toggling the data node 316T in the cross-coupled inverter circuit 314 described above from the first supply voltage $V_{SUP1}$ to the second supply voltage $V_{SUP2}$ is described with reference to FIG. 3. While the data node 316T is at the first supply voltage $V_{SUP1}$, the complement data node 316C is at the second supply voltage $V_{SUP2}$. The second supply voltage $V_{SUP2}$ provided to the gate 338G turns on the first P-type transistor 332T to couple the first voltage rail 324 to the data node 316T. The first supply voltage $V_{SUP1}$ provided to the gate 342G turns off the second P-type transistor 332C to decouple the complement data node 316C from the first voltage rail 324. This condition will remain stable in the cross-coupled inverter circuit 314 as long as the first pass-gate 318T and the second pass-gate 318C are turned off.

With the bit line 312T driven to the second supply voltage $V_{SUP2}$ and the first pass-gate 318T turned on, charge is drained from the data node 316T to reduce a voltage level $V_{DATA}$ on the data node 316T. However, the first P-type transistor 332T continues to provide charge to the data node 316T. If the first pass-gate 318T and the bit line 312T are capable of discharging the data node 316T faster than the new charge is provided by the first P-type transistor 332T, the voltage $V_{DATA}$ will be reduced. An effect of a reduction in the voltage $V_{DATA}$ on the data node 316T, which is coupled to the gate 342G is to begin to turn on the second P-type transistor 332C, which allows charge to flow into the complement data node 316C, increasing a voltage $V_{COMP}$ on the complement data node 316C. Since the complement data node 316C is coupled to the gate 338G, as the voltage $V_{COMP}$ on the complement data node 316C increases, the first P-type transistor begins to turn off, reducing the rate of charging (or current flow) into the data node 316T. The feedback of the cross-coupled inverter circuit 314 causes the transition to continue until the first P-type transistor 332T is turned off, the data node 316T is at the second supply voltage $V_{SUP2}$, the second P-type transistor 332C is turned on, and the complement data node 316C is at the first supply voltage $V_{SUP1}$.

As noted above, the first pass-gate 318T and the bit line 312T need to be capable of discharging the data node 316T faster than the new charge is provided by the first P-type transistor 332T. While this may be true in a write operation in which only one of the bit cell circuits 306(0)-306(N) is being toggled, the bit line 312T may not be capable of discharging a plurality of the bit cell circuits 306(0)-306(N) as may be required in a column set operation. The first voltage supply circuit 304T is provided to decouple the first voltage supply line 320T from the first voltage rail 324. In detail, the first voltage supply circuit 304T may be a P-type transistor (PFET) with a gate 346G coupled to the column set input 328, a first terminal 346S coupled to the first voltage rail 324, and a second terminal 346D coupled to the first voltage supply line 320T. As shown in the example in FIG. 3, the P-type transistor type of the first voltage supply circuit 304T is opposite in type to the N-type transistor type of the first pass-gate 318T. Activating the column set signal 330 to turn off the first voltage supply circuit 304T cuts off charge from the first voltage rail 324 to the data node 316T. In the absence of contention between a discharge current to the bit line 312T and a charge current from the first voltage rail 324, the bit line 312T is capable of discharging all of the data nodes 316T in the bit cell circuits 306(0)-306(N) to perform a column set operation.

Referring again to FIG. 3, the column circuit 302 includes a plurality of word lines 348(0)-348(N), each corresponding to one of the bit cell circuits 306(0)-306(N). A corresponding one of the word lines 348(0)-348(N) is coupled to a gate 350 of the first pass-gate 318T and a gate 352 of the second pass-gate 318C in each of the bit cell circuits 306(0)-306(N). In a column set operation to set the data node 316T of each of the bit cell circuits 306(0)-306(N) to the second supply voltage $V_{SUP2}$, the column set signal 330 on the column set input 328 is provided at the first supply voltage $V_{SUP1}$ of the first voltage rail 324, the bit line 312T is driven to the second supply voltage $V_{SUP2}$ of the second voltage rail 326, and the first supply voltage $V_{SUP1}$ is provided on each of the word lines 348(0)-348(N). In the column set operation, the complement data nodes 316C of each of the bit cell circuits 306(0)-306(N) are set to the first supply voltage $V_{SUP1}$ in response to the complement bit line 312C at the first supply voltage $V_{SUP1}$.

The second voltage supply circuit 304C may also be a transistor of the P-type with a first terminal 354S coupled to the first voltage rail 324, a second terminal 354D coupled to the second voltage supply line 320C, and a gate 354G coupled to the second voltage rail $V_{SUP2}$, such that the first supply voltage $V_{SUP1}$ is provided to the second voltage supply line 320C.

The memory circuit 300 also includes a plurality of first logic circuits 356(0)-356(N) corresponding to the word lines 348(0)-348(N). Each of the first logic circuits 356(0)-356(N) includes an output 358 coupled to one of the word lines 348(0)-348(N), a first input 360 configured to receive one of a plurality of row write signals 362(0)-362(N), and a second input 364 configured to receive an indication of the column set signal 330. The outputs 358 of each of the logic circuits 356(0)-356(N) are activated to supply the first supply voltage $V_{SUP1}$ to the corresponding word lines 348(0)-348(N) in response to the indication of the column set signal 330. The output 358 of one of the plurality of logic circuits 356(0)-356(N) may be activated to supply the first supply voltage $V_{SUP1}$ to a corresponding one of the word lines 348(0)-348(N) in response to one of the plurality of row write signals 362(0)-362(N) being activated in a write operation.

The memory array 300 also includes a bit driver circuit 366T and a complement bit driver circuit 366C that each includes a clock input WCLK_IN and a data input DIN. The clock input WCLK_IN is configured to receive a clock signal WCLK that activates the bit driver 366T and the complement bit driver 366C. When the clock signal WCLK is activated, which may be indicated by a voltage level (e.g., first supply voltage $V_{SUP1}$), the bit driver circuit 366T drives the bit line 312T, and the complement bit driver circuit drives the complement bit line 312C. In a write operation, a data signal DATA is provided to the data input DIN of the bit driver circuit 366T, and the bit line 312T is driven to a voltage state corresponding to the data signal DATA. A complement of the data signal DATA is provided to the data input DIN of the complement bit driver circuit 366C, and a voltage level corresponding to the complement of the data signal DATA is driven on the complement bit line 312C. Thus, as an example, if the data signal DATA is at the first supply voltage $V_{SUP1}$, the bit driver circuit 366T drives the bit line 312T to the first supply voltage $V_{SUP1}$ (e.g., binary "1") and the complement bit driver circuit 366C drives the complement bit line 312C to the second supply voltage $V_{SUP2}$ (e.g., binary "0"). In a column set operation, the data signal DATA is set to the second supply voltage $V_{SUP2}$ and the bit driver circuit 366T drives the bit line 312T to the second supply voltage $V_{SUP2}$. In response to each of the plurality of word lines 348(0)-348(N) driven to the first supply voltage $V_{SUP1}$ and the bit line 312T driven to a second supply voltage $V_{SUP2}$ of the second voltage rail 326, the data node 316T of each bit cell circuit of the plurality of bit cell circuits 306(0)-306(N) is set to the second supply voltage $V_{SUP2}$. In response to the complement bit line 312C comprising a first supply voltage $V_{SUP1}$, the complement data node 316C of the plurality of bit cell circuits 306(0)-306(N) is set to the first supply voltage $V_{SUP1}$.

Figure 4:
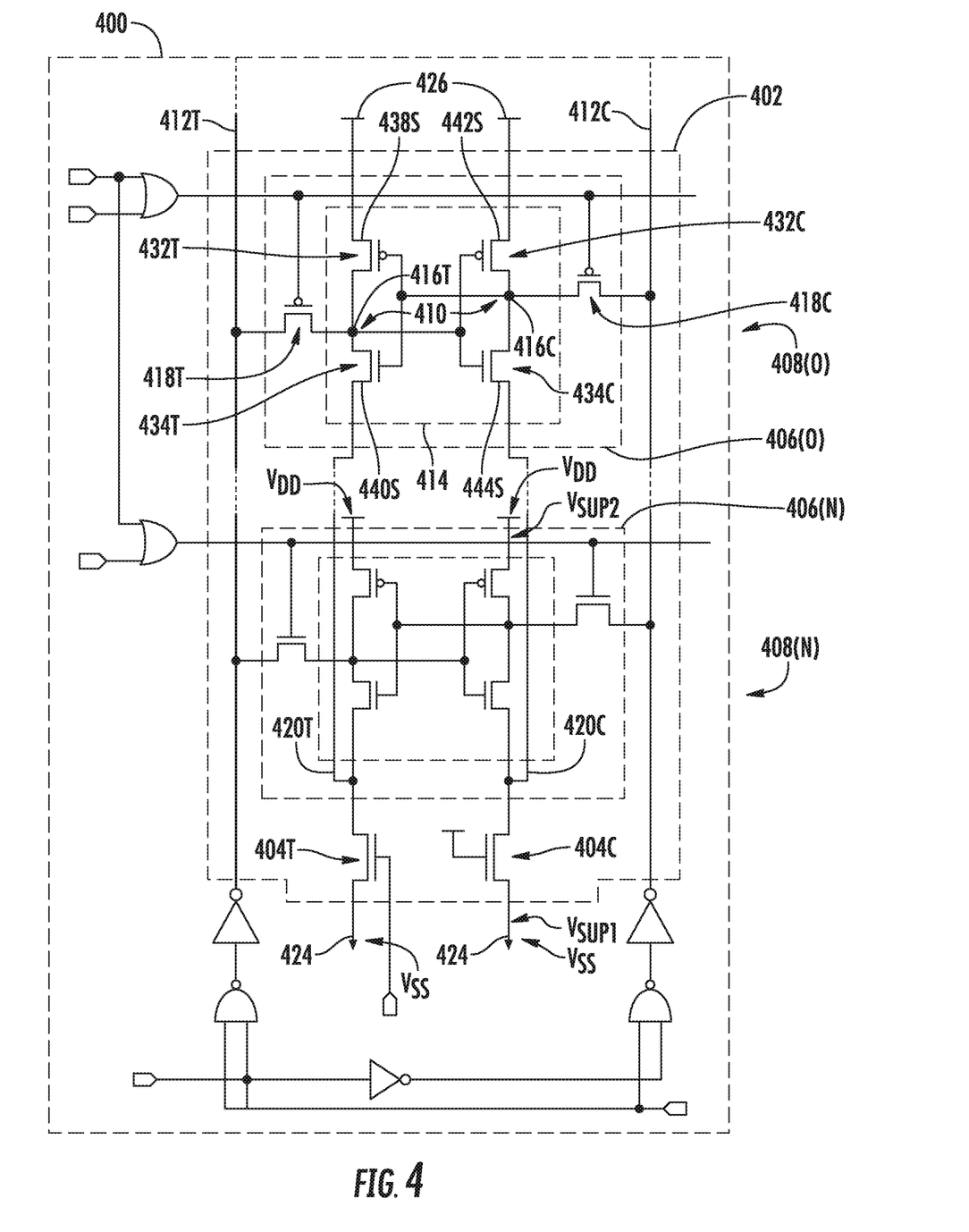
FIG. 4 is a schematic diagram of another exemplary memory array including a column circuit including a voltage supply circuit to cut off a supply voltage to avoid contention in a column set operation setting bit cell circuits to a second predetermined value.

FIG. 4 is a schematic diagram of another exemplary memory array circuit 400, also referred to herein as memory array 400, including a column circuit 402 including a voltage supply circuit 404T to cut off a first supply voltage $V_{SUP1}$ to avoid contention in a column set operation setting a plurality of bit cell circuits 406(0)-406(N) in the column circuit 402 to a predetermined value. The column circuit 402 includes bit cell circuits 406(0)-406(N) in rows 408(0)-408(N) to store information 410, such as information indicating whether a cache line in a corresponding one of the rows 408(0)-408(N) in the memory array 400 or another memory array is valid. The column circuit 402 includes bit line 412T and complement bit line 412C coupled to each of the plurality of bit cell circuits 406(0)-406(N). Each of the plurality of bit cell circuits 406(0)-406(N) includes a cross-coupled inverter circuit 414 identical to the cross-coupled inverter circuits 314 in FIG. 3, including a data node 416T and a complement data node 416C. The bit cell circuits 406(0)-406(N) include a first pass-gate 418T coupled to the data node 416T and the bit line 412T. The bit cell circuits 406(0)-406(N) include a second pass-gate 418C coupled to the complement data node 416C and the complement bit line 412C. The column circuit 402 includes a first voltage supply line 420T and a second voltage supply line 420C. The first voltage supply line 420T is coupled to the first voltage supply circuit 404T and a first voltage rail 424. A second voltage supply circuit 404C is coupled to the second voltage supply line and the first voltage rail 424. The bit cell circuits 406(0)-406(N) are also coupled to the second voltage rail 426.

The column circuit 402 in FIG. 4 is the same in many aspects to the column circuit 302 in FIG. 3, except as described otherwise herein. In particular, the column circuit 402 in FIG. 4 is configured for a column set operation that sets all the data nodes 416T of the bit cell circuits 406(0)-406(N) to the power supply voltage $V_{DD}$, in contrast to the column circuit 302 in FIG. 3, which sets all the bit cell circuits 306(0)-306(N) to the reference voltage $V_{SS}$ in a column set operation. The first voltage rail 424 is a reference voltage (e.g., ground) rail, and the second voltage rail 426 is the power supply voltage rail. Thus, in the memory array 400 in FIG. 4, the first supply voltage $V_{SUP1}$ is the reference voltage $V_{SS}$ (e.g., ground), and the second supply voltage $V_{SUP2}$ is the power supply voltage $V_{DD}$. The first pass-gate 418T and the second pass-gate 418C are P-type transistors. The cross-coupled inverter circuit 414 includes a first P-type transistor 432T, a first N-type transistor 434T, a second P-type transistor 432C, and a second N-type transistor 434C. The first voltage supply circuit 404T and the second voltage supply circuit 404C are N-type transistors. First terminals 438S and 442S of the first P-type transistor 432T and the second P-type transistor 432C are coupled to the second voltage rail 426 (power supply rail). A second terminal 440S of the first N-type transistor 434T is coupled to the first voltage supply line 420T, and the second terminal 444S of the second N-type transistor 434C is coupled to the second voltage supply line 420C.

In a write operation, there is contention between the bit line 412T charging the data node 416T of the bit cell circuits 406(0)-406(N) and a first N-type transistor 434T discharging the data node 416T to the first voltage rail 424 (e.g., the ground rail at 0V, for example). The bit line 412T is capable of overcoming the discharging current provided by the first N-type transistor 434T in the cross-coupled inverter circuit 414 in a write operation by charging the data node 416T to the second voltage supply $V_{SUP2}$ (e.g., $V_{DD}$). However, the bit line 412T cannot provide sufficient charge current to the data nodes 416T of many of the bit cell circuits 406(0)-406(N) to overcome the combined discharge currents of the first N-type transistors 434T in a column set operation. Thus, the first voltage supply circuit 404T is provided to, in response to the column set signal 430, decouple or cut off the first voltage supply line 420T from the first voltage rail 424 (e.g., the ground rail). In this manner, the bit line 412T can set each of the data nodes 416T to the second voltage supply $V_{SUP2}$ in a column set operation.

Figure 5A:
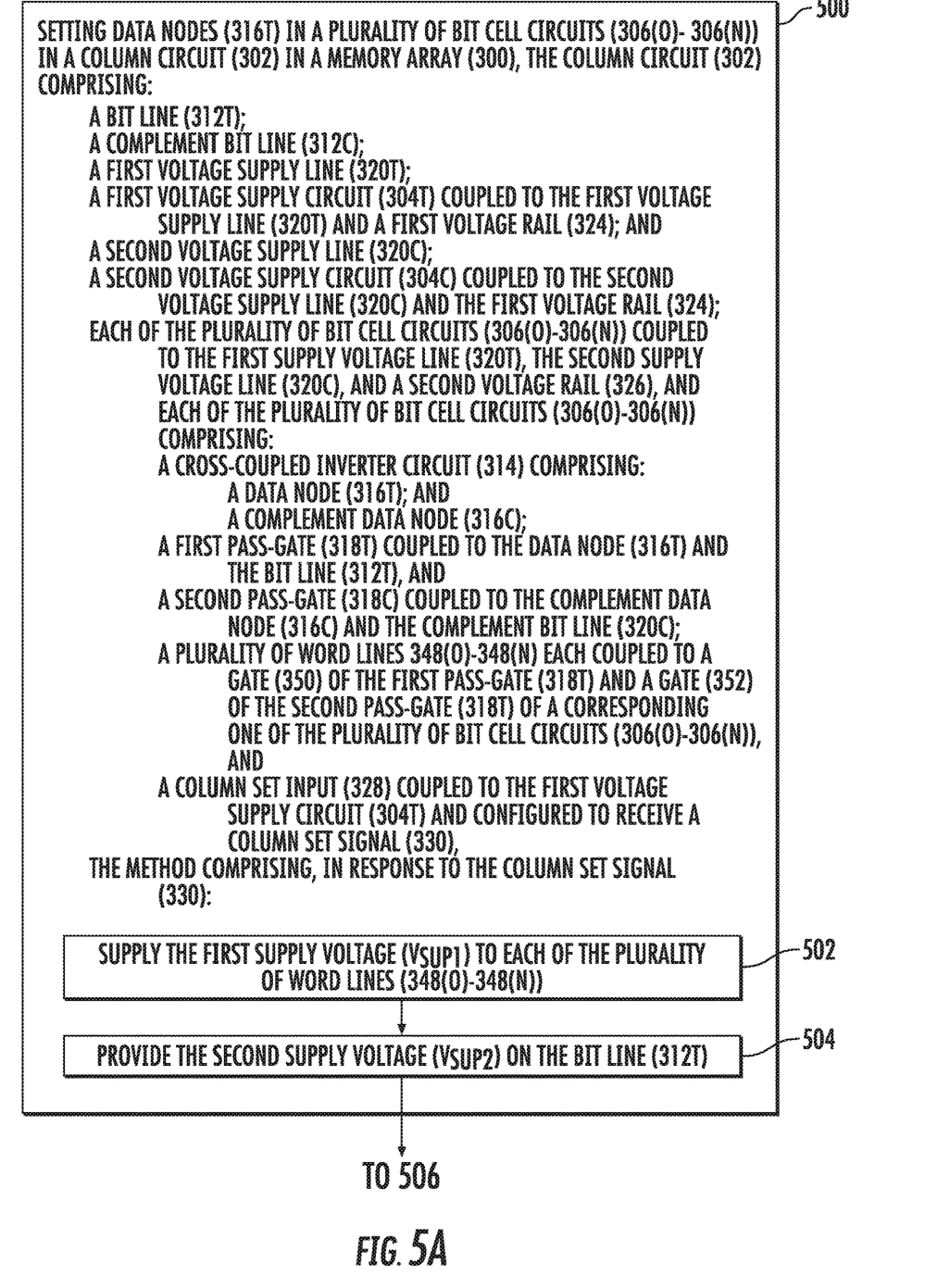
FIGS. 5A and 5B are a flow chart of a method of setting data nodes in bit cell circuit in a column circuit of a memory array in a column set operation.
Figure 5B:
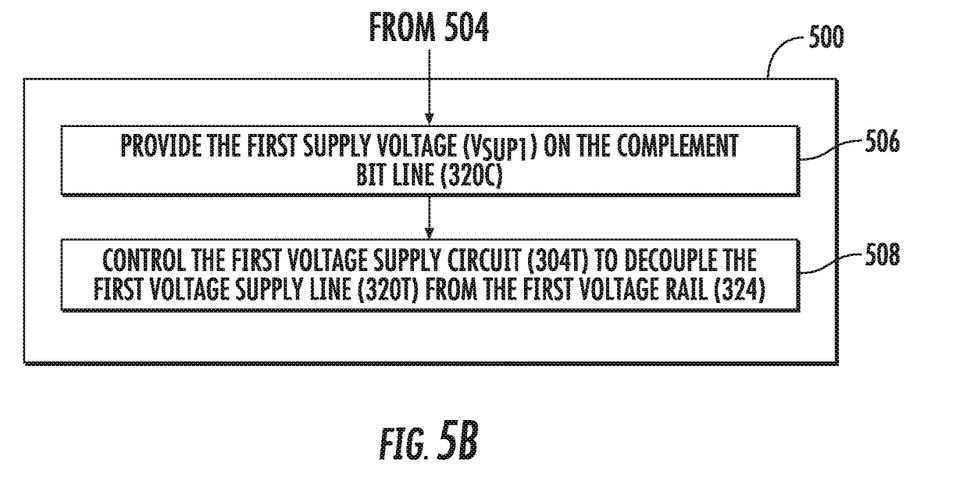

FIG. 5 is a flow chart of a method of setting data nodes 316T in a plurality of bit cell circuits 306(0)-306(N) in a column circuit 302 in a memory array 300, the column circuit 302 comprising a bit line 312T, a complement bit line 312C, a first voltage supply line 320T, a first voltage supply circuit 304T coupled to the first voltage supply line 320T and a first voltage rail 324, a second voltage line 326, and a second voltage supply circuit 304C coupled to the second voltage supply line 320C and the first voltage rail 324. Each of the plurality of bit cell circuits 306(0)-306(N) coupled to the first voltage supply line 320T, the second voltage supply line 320C, and a second voltage rail 326. Each of the plurality of bit cell circuits 306(0)-306(N) comprising a cross-coupled inverter circuit 314 comprising a data node 316T and a complement data node 316C. Each of the plurality of bit cell circuits 306(0)-306(N) further comprising a first pass-gate 318T coupled to the data node 316T and the bit line 320T, a second pass-gate 318C coupled to the complement data node 316C and the complement bit line 320C, a plurality of word lines 348(0)-348(N) each coupled to a gate 350 of the first pass-gate 318T and a gate 352 of the second pass-gate 318C of a corresponding one of the plurality of bit cell circuits 306(0)-306(N), and a column set input 328 coupled to the first voltage supply circuit 304T and configured to receive a column set signal 330 (block 500). The method comprises, in response to the column set signal 330, supplying the first supply voltage $V_{SUP1}$ to each of the plurality of word lines 348(0)-348(N) (block 502). The method includes providing the second supply voltage $V_{SUP2}$ on the bit line 312T (block 504). The method includes providing the first supply voltage $V_{SUP1}$ on the complement bit line (block 506) and controlling the first voltage supply circuit 304T to decouple the first voltage supply line 320T from the first voltage rail 324 (block 508).

Figure 6:
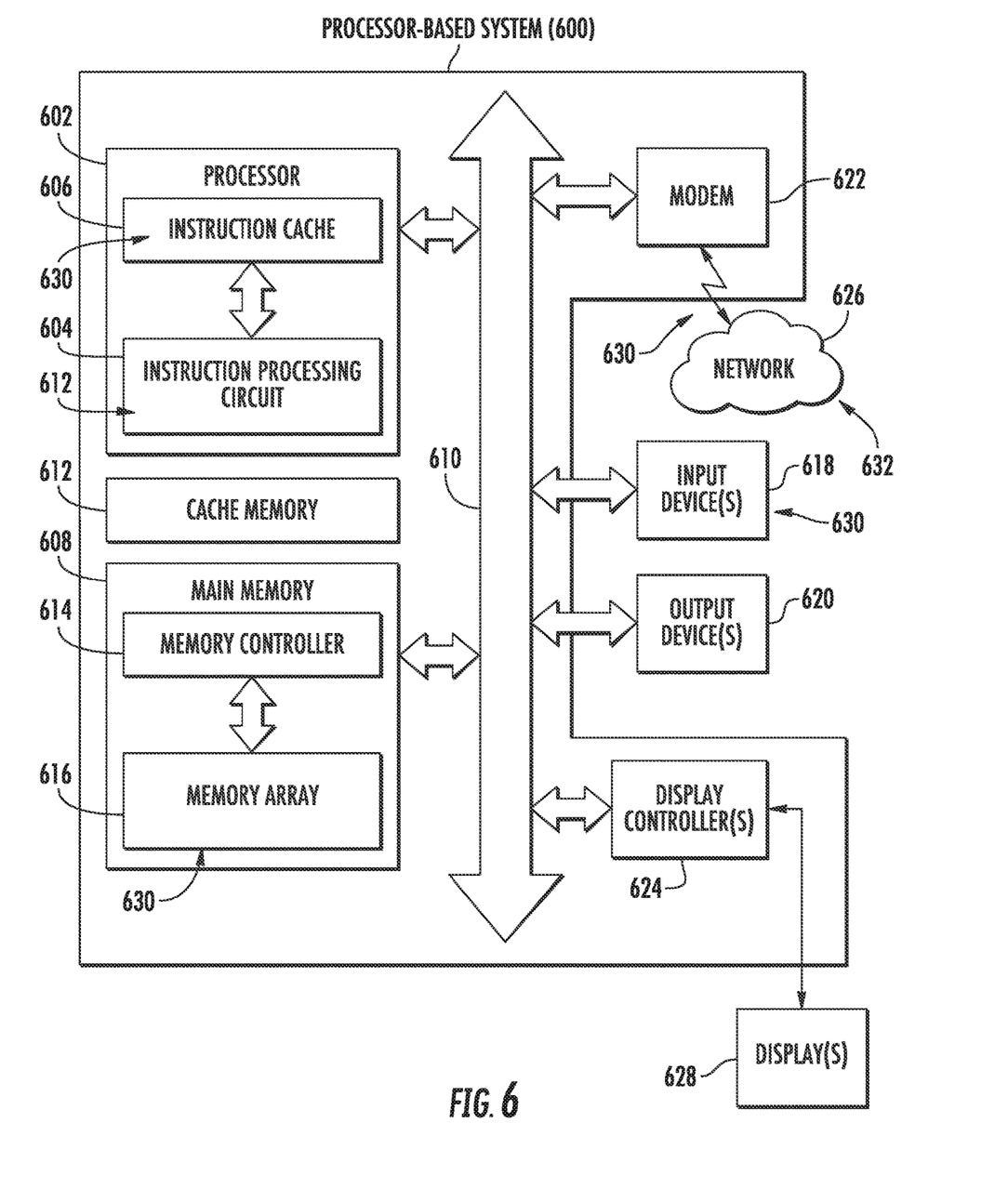
FIG. 6 is a block diagram of an exemplary processor-based system including a plurality of devices coupled to a system bus, wherein one or more integrated circuits (ICs) in the processor-based system include an exemplary memory array including a column circuit for column set operation to set all bit cell circuits in the column to a value.

FIG. 6 is a block diagram of an exemplary processor-based system 600 that includes a processor 602 (e.g., a microprocessor) that includes an instruction processing circuit 604. The processor-based system 600 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 600 includes the processor 602. The processor 602 represents one or more general-purpose processing circuits, such as a microprocessor, central processing unit, or the like. More particularly, the processor 602 may be an EDGE instruction set microprocessor or other processor implementing an instruction set that supports explicit consumer naming for communicating produced values resulting from execution of producer instructions. The processor 602 is configured to execute processing logic in instructions for performing the operations and steps discussed herein. In this example, the processor 602 includes an instruction cache 606 for temporary, fast access memory storage of instructions accessible by the instruction processing circuit 604. Fetched or prefetched instructions from a memory, such as a main memory 608, over a system bus 610, are stored in the instruction cache 606. Data may be stored in a cache memory 612 coupled to the system bus 610 for low-latency access by the processor 602. The instruction processing circuit 604 is configured to process instructions fetched into the instruction cache 606 and process the instructions for execution.

The processor 602 and the main memory 608 are coupled to the system bus 610 and can intercouple peripheral devices included in the processor-based system 600. As is well known, the processor 602 communicates with these other devices by exchanging address, control, and data information over the system bus 610. For example, the processor 602 can communicate bus transaction requests to a memory controller 614 in the main memory 608 as an example of a slave device. Although not illustrated in FIG. 6, multiple system buses 610 could be provided; wherein each system bus 610 constitutes a different fabric. In this example, the memory controller 614 is configured to provide memory access requests to a memory array 616 in the main memory 608. The memory array 616 is comprised of an array of storage bit cells for storing data. The main memory 608 may be a read-only memory (ROM), flash memory, dynamic random-access memory (DRAM), such as synchronous DRAM (SDRAM), etc., and/or static memory (e.g., flash memory, SRAM, etc.), as non-limiting examples.

Other devices can be connected to the system bus 610. As illustrated in FIG. 6, these devices can include the main memory 608, one or more input device(s) 618, one or more output device(s) 620, a modem 622, and one or more display controllers 624, as examples. The input device(s) 618 can include any type of input device, including but not limited to input keys, switches, voice processors, etc. The output device(s) 620 can include any type of output device, including but not limited to audio, video, other visual indicators, etc. The modem 622 can be any device configured to allow exchange of data to and from a network 626. The network 626 can be any type of network, including but not limited to a wired or wireless network, a private or public network, a local area network (LAN), a wireless local area network (WLAN), a wide area network (WAN), a BLUETOOTH™ network, and the Internet. The modem 622 can be configured to support any type of communications protocol desired. The processor 602 may also be configured to access the display controller(s) 624 over the system bus 610 to control information sent to one or more displays 628. The display(s) 628 can include any type of display, including but not limited to a cathode ray tube (CRT), a liquid crystal display (LCD), a plasma display, etc.

The processor-based system 600 in FIG. 6 may include a set of instructions 630 to be executed by the processor 602 for any application desired according to the instructions. The instructions 630 may be stored in the main memory 608, processor 602, and/or instruction cache 606 as examples of a non-transitory computer-readable medium 632. The instructions 630 may also reside, completely or at least partially, within the main memory 608 and/or within the processor 602 during their execution. The instructions 630 may further be transmitted or received over the network 626 via the modem 622, such that the network 626 includes computer-readable medium 632.

While the computer-readable medium 632 is shown in an exemplary embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The main memory 608 in the processor-based system 600, and any other memory devices therein, may include a column circuit including a voltage supply circuit to cut off a supply voltage to avoid contention in a column set operation setting bit cell circuits to a first predetermined value, as illustrated in FIGS. 3 and 4.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product or software that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be referenced throughout the above description may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A column circuit comprising a plurality of bit cell circuits, the column comprising:
    a bit line;
    a complement bit line;
    a first voltage supply line;
    a first voltage supply circuit coupled to the first voltage supply line and a first voltage rail;
    a second voltage supply line; and
    a second voltage supply circuit coupled to the second voltage supply line and the first voltage rail;
    each of the plurality of bit cell circuits coupled to the first voltage supply line, the second voltage supply line, and a second voltage rail, and comprising:
        a cross-coupled inverter circuit comprising:
            a data node; and
            a complement data node;
        a first pass-gate coupled to the data node and the bit line; and
        a second pass-gate coupled to the complement data node and the complement bit line; and
    a column set input coupled to the first voltage supply circuit and configured to supply a column set signal to control the first voltage supply circuit to decouple the first voltage supply line from the first voltage rail,
    wherein the second voltage supply circuit comprises a transistor comprising a first terminal coupled to the first voltage rail, a second terminal coupled to the second voltage supply line, and a gate coupled directly to the second voltage rail.

2. The column circuit of claim 1, further comprising a plurality of word lines each corresponding to one of the plurality of bit cell circuits, wherein in each bit cell circuit of the plurality of bit cell circuits, the corresponding word line is coupled to a gate of the first pass-gate and a gate of the second pass-gate.

3. The column circuit of claim 1, wherein the column circuit is configured to, in response to each of the plurality of word lines comprising the first supply voltage and the bit line comprising a second supply voltage of the second voltage rail, set the data node of each of the plurality of bit cell circuits to the second supply voltage.

4. The column circuit of claim 3, wherein, in response to the complement bit line comprising the first supply voltage, set the complement data node of each of the plurality of bit cell circuits to the first supply voltage.

5. The column circuit of claim 1, wherein the first voltage supply circuit comprises a transistor comprising a first terminal coupled to the first voltage supply line, a second terminal coupled to the first voltage rail, and a gate coupled to the column set input.

6. The column circuit of claim 5, wherein:
    the first pass-gate comprises one of an N-type transistor and a P-type transistor; and
    the first voltage supply circuit comprises one of the P-type transistor and the N-type transistor opposite the first pass-gate.

7. The column circuit of claim 1, wherein the cross-coupled inverter circuit further comprises:
    a first P-type transistor comprising:
        a first terminal;
        a second terminal coupled to the data node; and
        a gate coupled to the complement data node;
    a first N-type transistor comprising:
        a first terminal coupled to the data node;
        a second terminal; and
        a gate coupled to the complement data node;
    a second P-type transistor comprising:
        a first terminal;
        a second terminal coupled to the complement data node; and
        a gate coupled to the data node;
    a second N-type transistor comprising:
        a first terminal coupled to the complement data node;
        a second terminal; and
        a gate coupled to the data node.

8. The column circuit of claim 7, wherein:
    the first supply voltage comprises a power supply voltage ($V_{DD}$);
    the second supply voltage comprises a reference voltage ($V_{SS}$);
    the first pass-gate comprises a third N-type transistor;
    the first terminal of the first P-type transistor is coupled to the first voltage supply line;
    the first terminal of the second P-type transistor is coupled to the second voltage supply line;
    the second terminals of the first N-type transistor and the second N-type transistor are coupled to the second supply rail.

9. The column circuit of claim 7, wherein:
    the first supply voltage comprises a reference voltage ($V_{SS}$);
    the second supply voltage comprises a power supply voltage ($V_{DD}$); and
    the first pass-gate comprises a third P-type transistor;
    the first terminals of the first P-type transistor and the second P-type transistor are coupled to the second supply rail;
    the second terminal of the first N-type transistor is coupled to the first voltage supply line;
    the second terminal of the second N-type transistor is coupled to the second voltage supply line.

10. A memory array circuit comprising:
    a column circuit comprising:
        a plurality of bit cell circuits;
        a bit line;
        a complement bit line;
        a first voltage supply line;
        a first voltage supply circuit coupled to the first voltage supply line and a first voltage rail;
        a second voltage supply line; and
        a second voltage supply circuit coupled to the second voltage supply line and the first voltage rail;
    wherein:
        each of the plurality of bit cell circuits coupled to the first voltage supply line, the second voltage supply line, and a second voltage rail, and comprising:
            a cross-coupled inverter circuit comprising:
                a data node; and
                a complement data node;

a first pass-gate coupled to the data node and the bit line; and
a second pass-gate coupled to the complement data node and the complement bit line; and
a column set input coupled to the first voltage supply circuit includes a column set signal to control the first voltage supply circuit to decouple the first voltage supply line from the first voltage rail,
wherein the second voltage supply circuit comprises a transistor comprising a first terminal coupled to the first voltage rail, a second terminal coupled to the second voltage supply line, and a gate coupled directly to the second voltage rail.

11. The memory array circuit of claim 10, further comprising a plurality of word lines, each corresponding to one of the plurality of bit cell circuits, wherein, in each bit cell circuit of the plurality of bit cell circuits, the corresponding word line is coupled to a gate of the first pass-gate and a gate of the second pass-gate.

12. The memory array circuit of claim 11, further comprising:
a plurality of first logic circuits corresponding to the plurality of word lines, each first logic circuit of the plurality of first logic circuits comprising:
an output coupled to a corresponding one of the plurality of word lines;
a first input configured to receive one of a plurality of row write signals; and
a second input configured to receive an indication of the column set signal,
wherein the output of each of the plurality of logic circuits is configured to supply the first supply voltage to the corresponding word line in response to the indication of the column set signal.

13. The memory array circuit of claim 12, wherein the output of one of the plurality of logic circuits is configured to supply the first supply voltage to a corresponding word line in response to the corresponding one of the plurality of row write signals in a write operation.

14. The memory array circuit of claim 11, further comprising:
a bit driver circuit configured to provide the second supply voltage on the bit line in response to the indication of the column set signal;
a complement bit driver circuit configured to provide the first supply voltage on the complement bit line in response to a complement indication of the column set signal.

15. The memory array circuit of claim 14, wherein:
the bit driver circuit is configured to provide one of the first supply voltage and the second supply voltage on the bit line in response to a write operation;
the complement bit driver is configured to provide one of the second supply voltage and the first supply voltage on the complement bit line in response to a write operation.

16. A method of setting data nodes in a plurality of bit cell circuits in a column circuit in a memory array, the column circuit comprising:
a bit line;
a complement bit line;
a first voltage supply line;
a first voltage supply circuit coupled to the first voltage supply line and a first voltage rail; and
a second voltage supply line;
a second voltage supply circuit comprising a transistor comprising a first terminal coupled to the first voltage rail, a second terminal coupled to the second voltage supply line, and a gate coupled directly to the second voltage rail;
each of the plurality of bit cell circuits coupled to the first voltage supply line, the second voltage supply line, and a second voltage rail, and each of the plurality of bit cell circuits comprising:
a cross-coupled inverter circuit comprising:
a data node; and
a complement data node;
a first pass-gate coupled to the data node and the bit line; and
a second pass-gate coupled to the complement data node and the complement bit line;
a plurality of word lines each coupled to a gate of the first pass-gate and a gate of the second pass-gate of a corresponding one of the plurality of bit cell circuits, and
a column set input coupled to the first voltage supply circuit and configured to receive a column set signal,
the method comprising:
in response to the column set signal:
supplying the first supply voltage to each of the plurality of word lines;
providing the second supply voltage on the bit line;
providing the first supply voltage on the complement bit line; and
controlling the first voltage supply circuit to decouple the first voltage supply line from the first voltage rail.

17. The method of claim 16, further comprising:
in response to a write operation:
driving one of the first supply voltage and the second supply voltage on the bit line based on a first data signal;
driving one of the second supply voltage and the first supply voltage on the complement bit line based on the first data signal;
driving one of the plurality of word lines to the first supply voltage based on a plurality of row write signals.

* * * * *